(12) United States Patent
Goyal et al.

(10) Patent No.: US 9,954,541 B1
(45) Date of Patent: Apr. 24, 2018

(54) BULK ACOUSTIC WAVE RESONATOR BASED FRACTIONAL FREQUENCY SYNTHESIZER AND METHOD OF USE

(71) Applicant: Integrated Device Technology, Inc., San Jose, CA (US)

(72) Inventors: Pankaj Goyal, Sunnyvale, CA (US); Stephen E. Aycock, Napa, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 106 days.

(21) Appl. No.: 15/084,067

(22) Filed: Mar. 29, 2016

(51) Int. Cl.
| H03L 7/183 | (2006.01) |
| H03L 7/099 | (2006.01) |
| H03L 7/093 | (2006.01) |
| H03B 5/36  | (2006.01) |
| H03B 5/32  | (2006.01) |
| H03B 5/12  | (2006.01) |
| H03L 7/23  | (2006.01) |

(52) U.S. Cl.
CPC ............. *H03L 7/183* (2013.01); *H03B 5/12* (2013.01); *H03B 5/32* (2013.01); *H03B 5/326* (2013.01); *H03B 5/366* (2013.01); *H03L 7/093* (2013.01); *H03L 7/0992* (2013.01); *H03L 7/23* (2013.01)

(58) Field of Classification Search
CPC ....... H03L 7/1976; H03L 7/1974; H03L 7/23; H03L 7/099; H03L 2207/50; H03L 1/026; H03L 7/087; H03L 7/0992; H03B 5/12; H03B 5/326; H03B 5/32
USPC ................... 331/2, 16, 17, 34, 107 A, 18
See application file for complete search history.

(56) References Cited

U.S. PATENT DOCUMENTS

| 4,684,941 | A  | 8/1987  | Smith et al. |
| 4,862,485 | A  | 8/1989  | Guinea et al. |
| 5,388,060 | A  | 2/1995  | Adams et al. |
| 5,663,105 | A  | 9/1997  | Sua et al. |
| 5,748,949 | A  | 5/1998  | Johnston et al. |
| 5,757,240 | A  | 5/1998  | Boerstler et al. |
| 5,848,355 | A  | 12/1998 | Rasor et al. |
| 5,903,195 | A  | 5/1999  | Lukes et al. |
| 6,219,797 | B1 | 4/2001  | Liu et al. |
| 6,259,327 | B1 | 7/2001  | Balistreri et al. |
| 6,640,311 | B1 | 10/2003 | Knowles |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — Arnold Kinkead
(74) *Attorney, Agent, or Firm* — Glass & Associates; Kenneth Glass; Molly Sauter

(57) ABSTRACT

A frequency synthesizer comprising a first phase locked loop (PLL) circuit coupled to receive a reference frequency signal from a reference oscillator, the first PLL circuit comprising a first voltage controlled oscillator (VCO) having a bulk acoustic wave (BAW) resonator and a first fractional feedback divider circuit, the first PLL circuit outputting a first tuned frequency signal and a first plurality of integer divider circuits coupled to receive the first tuned frequency signal from the first PLL circuit and each of the first plurality of integer-only post-PLL divider circuits to provide one of a plurality of output frequency signals of the frequency synthesizer.

10 Claims, 10 Drawing Sheets

(56) References Cited

U.S. PATENT DOCUMENTS

| | | | |
|---|---|---|---|
| 6,643,787 B1 | 11/2003 | Zerbe et al. |
| 6,650,193 B2 | 11/2003 | Endo et al. |
| 6,683,506 B2 | 1/2004 | Ye et al. |
| 6,727,767 B2 | 4/2004 | Takada |
| 6,768,387 B1 | 7/2004 | Masuda et al. |
| 6,870,411 B2 | 3/2005 | Shibahara et al. |
| 6,959,066 B2 | 10/2005 | Wang et al. |
| 7,012,476 B2 | 3/2006 | Ogiso |
| 7,323,916 B1 | 1/2008 | Sidiropoulos et al. |
| 7,405,594 B1 | 7/2008 | Xu |
| 7,434,083 B1 | 10/2008 | Wilson |
| 7,541,848 B1 | 6/2009 | Masuda |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,714,565 B2 | 5/2010 | Abuhamdeh et al. |
| 7,737,739 B1 | 6/2010 | Bi |
| 7,741,981 B1 | 6/2010 | Wan et al. |
| 7,750,618 B1 | 7/2010 | Fang et al. |
| 7,756,197 B1 | 7/2010 | Ferguson et al. |
| 7,786,763 B1 | 8/2010 | Bal et al. |
| 7,800,422 B2 | 9/2010 | Lee et al. |
| 7,816,959 B1 | 10/2010 | Isik |
| 7,882,404 B2 | 2/2011 | Dai et al. |
| 7,907,625 B1 | 3/2011 | MacAdam |
| 7,928,880 B2 | 4/2011 | Tsukamoto |
| 7,941,723 B1 | 5/2011 | Lien et al. |
| 8,010,072 B1 | 8/2011 | Nathawad |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi |
| 8,305,154 B1 | 11/2012 | Kubena et al. |
| 8,416,107 B1 | 4/2013 | Wan et al. |
| 8,432,231 B2 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 9,112,517 B1* | 8/2015 | Lye .................. H03L 7/087 |
| 9,455,854 B2 | 9/2016 | Gao |
| 2002/0079937 A1 | 6/2002 | Xanthopoulos |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana |
| 2005/0170787 A1 | 8/2005 | Yamamoto et al. |
| 2006/0103436 A1 | 5/2006 | Saitou et al. |
| 2006/0119402 A1 | 6/2006 | Thomsen et al. |
| 2006/0197614 A1 | 9/2006 | Roubadia et al. |
| 2006/0229018 A1 | 10/2006 | Mlinarsky et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla |
| 2008/0246546 A1 | 10/2008 | Ha et al. |
| 2009/0083567 A1 | 3/2009 | Kim et al. |
| 2009/0128242 A1* | 5/2009 | Fitzgibbon ............ H03L 7/0898 331/17 |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai |
| 2010/0090731 A1 | 4/2010 | Casagrande |
| 2010/0109714 A1 | 5/2010 | Lindfors et al. |
| 2010/0164761 A1 | 7/2010 | Wan et al. |
| 2010/0194483 A1 | 8/2010 | Storaska et al. |
| 2010/0240323 A1 | 9/2010 | Qiao et al. |
| 2010/0323643 A1 | 12/2010 | Ridgers |
| 2011/0006936 A1 | 1/2011 | Lin et al. |
| 2011/0032013 A1 | 2/2011 | Nelson et al. |
| 2011/0095784 A1 | 4/2011 | Behel et al. |
| 2011/0234204 A1 | 9/2011 | Tamura et al. |
| 2011/0234433 A1 | 9/2011 | Aruga et al. |
| 2011/0264435 A1 | 10/2011 | Jamnejad et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0043999 A1* | 2/2012 | Quevy .................. H03L 1/022 327/147 |
| 2012/0161829 A1 | 6/2012 | Fernald |
| 2012/0200330 A1 | 8/2012 | Kawagoe et al. |
| 2012/0249207 A1 | 10/2012 | Natsume et al. |
| 2012/0262315 A1 | 10/2012 | Kapusta et al. |
| 2012/0293221 A1 | 11/2012 | Ma et al. |
| 2012/0297231 A1 | 11/2012 | Qawami et al. |
| 2012/0317365 A1 | 12/2012 | Elhamias |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1 | 11/2013 | Thirugnanam et al. |
| 2014/0021990 A1 | 1/2014 | Na et al. |
| 2014/0029646 A1 | 1/2014 | Foxcroft et al. |
| 2014/0210532 A1 | 7/2014 | Jenkins |
| 2014/0327478 A1 | 11/2014 | Horng et al. |
| 2014/0347941 A1 | 11/2014 | Jose et al. |
| 2015/0028960 A1 | 1/2015 | Yorita |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1 | 7/2015 | Ihm et al. |
| 2016/0013796 A1 | 1/2016 | Choi |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase- Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

(56) References Cited

OTHER PUBLICATIONS

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

\* cited by examiner

| Desired Output Frequency Signal MHz | Desired Output Frequency Signal MHz | Desired Output Frequency Signal MHz | Desired Output Frequency Signal MHz | Desired Output Frequency Signal MHz | Desired Output Frequency Signal MHz | Desired Output Frequency Signal MHz | Desired Output Frequency Signal MHz |
|---|---|---|---|---|---|---|---|
| 0.032 | 4.096 | 8.4672 | 13.875 | 19.44 | 27.045 | 34.98 | 35.26 | 40.805 | 96 |
| 0.032768 | 4.194304 | 8.664 | 14.112 | 19.6608 | 27.075 | 34.99 | 35.27 | 40.815 | 100 |
| 0.038 | 4.332 | 8.86724 | 14.25 | 19.68 | 27.095 | 35 | 35.28 | 40.825 | 106.25 |
| 0.0775 | 4.4336188 | 9.216 | 14.318182 | 19.8 | 27.12 | 35.01 | 35.29 | 40.835 | 106.5 |
| 0.1 | 4.608 | 9.54545 | 14.35 | 20 | 27.125 | 35.02 | 35.3 | 40.875 | 116 |
| 0.12 | 4.897 | 9.6 | 14.4 | 20.25 | 27.145 | 35.0208 | 35.328 | 40.885 | 122.88 |
| 0.131072 | 4.9152 | 9.8304 | 14.7456 | 20.2752 | 27.175 | 35.03 | 36 | 40.915 | 125 |
| 1 | 5 | 10 | 14.75 | 20.48 | 27.195 | 35.04 | 36.864 | 40.935 | 148.5 |
| 1.008 | 5.034963 | 10.23 | 14.85 | 20.736 | 27.225 | 35.05 | 37.5 | 40.945 | 133.33333 |
| 1.544 | 5.0688 | 10.24 | 15 | 21.47727 | 27.255 | 35.06 | 38.4 | 40.96 | 150 |
| 1.8432 | 5.12 | 10.245 | 15.36 | 22.1184 | 27.456 | 35.07 | 38.88 | 40.975 | 153.6 |
| 2.048 | 5.185 | 10.368 | 15.6 | 22.5792 | 27.648 | 35.08 | 39 | 40.985 | 155.516 |
| 2.097152 | 5.5296 | 10.416667 | 16 | 22.625 | 28.224 | 35.09 | 40 | 40.985 | 155.52 |
| 2.4575 | 5.6448 | 11.0591 | 16.2 | 23.104 | 28.322 | 35.1 | 40.32 | 44.736 | 156.25 |
| 2.5 | 6 | 11.2896 | 16.257 | 23.9616 | 28.375 | 35.11 | 40.655 | 45.1584 | 161.13 |
| 2.56 | 6.063 | 11.454544 | 16.3676 | 24 | 28.636 | 35.12 | 40.665 | 48 | 161.1328 |
| 2.88 | 6.144 | 11.52 | 16.367867 | 24.5535 | 28.8 | 35.13 | 40.675 | 49.152 | 164.355 |
| 3.072 | 6.176 | 12 | 16.368 | 24.576 | 29.4912 | 35.14 | 40.685 | 49.408 | 166.6286 |
| 3.088 | 6.4 | 12.277727 | 16.369 | 24.704 | 30 | 35.15 | 40.695 | 49.83 | 173.4375 |
| 3.2768 | 6.4512 | 12.288 | 16.384 | 25 | 30.24 | 35.16 | 40.705 | 49.86 | 195.3215 |
| 3.575811 | 6.4983 | 12.352 | 16.5888 | 25.175 | 30.72 | 35.17 | 40.715 | 49.89 | 212.5 |
| 3.579545 | 6.5536 | 12.400625 | 16.67 | 25.8048 | 31.33344 | 35.18 | 40.725 | 50 | 250 |
| 3.582056 | 6.7458 | 12.8 | 16.8 | 26 | 32.768 | 35.19 | 40.735 | 51.84 | 312.5 |
| 3.595295 | 7.023 | 12.9024 | 16.9344 | 26.2144 | 33.1776 | 35.2 | 40.745 | 52.416 | 390.625 |
| 3.64 | 7.15909 | 12.96 | 17.328 | 26.5625 | 33.33 | 35.21 | 40.755 | 53.125 | |
| 3.6864 | 7.2 | 13 | 17.664 | 26.84436 | 33.8688 | 35.22 | 40.765 | 56.448 | |
| 3.93216 | 7.3728 | 13.5 | 17.734475 | 26.975 | 34.368 | 35.23 | 40.775 | 66.666 | |
| 4 | 8 | 13.51168 | 18.432 | 26.995 | 34.95 | 35.24 | 40.775 | 70.656 | |
| 4.032 | 8.184 | 13.56 | 18.816 | 27 | 34.96 | 35.25 | 40.785 | 77.76 | |

FIG. 6

BULK ACOUSTIC WAVE RESONATOR BASED FRACTIONAL FREQUENCY SYNTHESIZER AND METHOD OF USE

BACKGROUND OF THE INVENTION

Most modern systems have well defined operating states, or modes of operation and most of these systems use one or more frequency synthesizers to generate multiple output signals of different frequencies. Typical high performance frequency synthesizers utilize a phase locked loop (PLL) that is locked to the frequency of a crystal oscillator. In order to reduce the silicon area required to implement multiple frequencies, a single PLL frequency synthesizer employing multiple fractional frequency dividers at the output of the PLL frequency synthesizer is commonly used in order to provide the required output frequencies.

In the prior art, generating multiple output frequencies from a single PLL frequency synthesizer requires the use of multiple fractional frequencies dividers at the output of the PLL. Fractional frequency dividers are known to generate undesirable spurs in the output signal of the fractional frequency divider. While techniques are known in the art to enhance the spur compensation in the fractional frequency dividers, regardless of the whether the fractional frequency divider is positioned within the PLL feedback path or after the PLL, as a post-divider, the circuitry required for spur compensation can be very challenging to design. In addition, calibration algorithms and associated circuitry consume a large amount of die area, thus minimizing any benefits of using fractional frequency dividers at the output of the PLL to avoid multiple on-chip PLLs.

Accordingly, what is needed in the art is a compact, power efficient, system and method for generating multiple frequencies that are fractionally related to a reference signal and also have adequately suppressed spurs in the output spectrum.

SUMMARY

In one embodiment of the present invention, a frequency synthesizer is provided, including, a first phase locked loop (PLL) circuit coupled to receive a reference frequency signal from a reference oscillator, the first PLL circuit comprising a first voltage controlled oscillator (VCO) having a bulk acoustic wave (BAW) resonator and a first fractional feedback divider circuit, the first PLL circuit outputting a first tuned frequency signal and a first plurality of integer divider circuits coupled to receive the first tuned frequency signal of the first PLL circuit, each of the first plurality of integer divider circuits to provide one of a plurality of output frequency signals of the frequency synthesizer. In a particular embodiment, the frequency synthesizer may include one PLL circuit. In an additional embodiment, the frequency synthesizer may include two PLL circuits coupled in series.

In the present invention, the first fractional PLL circuit may include, a first phase detector having a first input coupled to receive the reference frequency signal of the reference oscillator and a second input coupled to receive a first feedback signal from the first fractional feedback divider circuit and a first loop filter coupled to receive a first difference signal from the first phase detector and to output a first control signal to the first VCO.

In order to provide a desired set of output frequency signals from the frequency synthesizer, the BAW resonator may be designed to have a center frequency and a frequency tuning range that is sufficient to generate the first plurality of output frequency signals from the first plurality of integer divider circuits, wherein a ratio of the frequency tuning range of the BAW resonator to the center frequency of the BAW resonator is a minimum ratio for the desired set of output frequency signals. Thus the percentage tuning range is kept to a minimum as a result of proper frequency planning of the PLL architecture.

In an additional embodiment, a method of generating a plurality of output frequency signals includes, receiving a reference frequency signal, generating a first tuned BAW generated frequency signal that is fractionally related to the reference frequency signal and dividing the first tuned BAW generated frequency signal by an integer value to generate one of a plurality of output frequency signals of the frequency synthesizer.

In accordance with the present invention a system and method are provided whereby multiple frequencies that are fractionally related to a reference frequency can be generated by a substantially spur-free frequency synthesizer employing a single PLL circuit.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 6 is a table illustrating a set of desired output frequencies of the frequency synthesizer, in accordance with an embodiment of the present invention.

DETAILED DESCRIPTION

Figure 1:
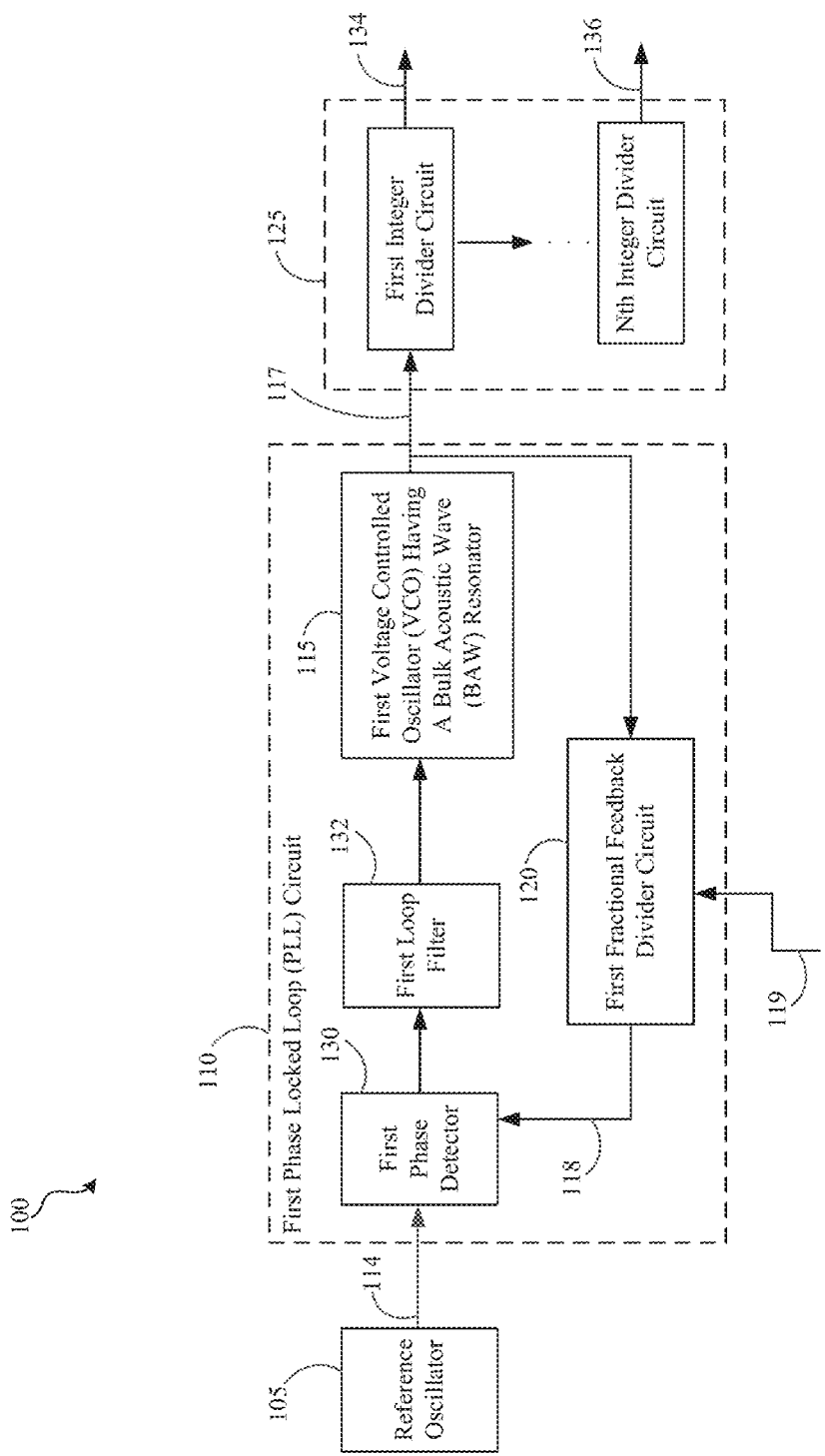
FIG. 1 is a block diagram of a frequency synthesizer having a single PLL circuit, in accordance with an embodiment of the present invention.

Representative embodiments of the present invention are described below with reference to various examples wherein like reference numerals are used throughout the description and several view of the drawings to indicate like or corresponding parts and further wherein the various elements are not necessarily drawn to scale.

High performance wireless and wireline applications increasingly demand the generation of GHz frequency reference signals with low phase noise, high stability and low power consumption. Additionally, reference generation at frequencies higher than that attainable with quartz resonators is increasingly needed for very wide bandwidth or high frequency phase locked loop circuits.

In order to generate the large number of high frequency signals that are required in multiple high performance wireless and wireline applications, numerous PLLs are normally used. However, in order to minimize the die area and the power requirements in the frequency synthesizer, it is desirable to be able to use a single phase locked loop (PLL) circuit to generate multiple output frequency signals that are fractionally related to an input reference signal of the PLL. It is also important that this PLL be highly programmable to reduce the IP development effort for multiple applications. Prior art techniques are known to employ multiple fractional frequency dividers at the output of the PLL to provide the necessary frequencies. However, fractional frequency dividers are known to introduce undesirable spurs into the output signal and placing the fractional frequency dividers outside of the PLL requires that additional circuitry to added to mitigate the spurs in the output signal.

In order to generate GHz frequency output signals, bulk acoustic wave (BAW) oscillators are known in the art as free running oscillators providing the reference frequency for the PLL of the frequency synthesizer. While, PLLs utilizing BAW-based oscillators provide improved phase noise and High-Q signals, BAW-based oscillators also exhibit poor temperature stability, as compared to quartz resonators, and a smaller tuning range. The limited tuning range of BAW oscillators and their temperature instability has prohibited the use of BAW-based oscillators as high frequency reference sources for a PLL of a frequency synthesizer in high performance applications.

The present invention provides a compact, spur-free, frequency synthesizer which can generate multiple frequencies that are fractionally related to a reference signal. In the present invention, the frequency synthesizer includes a BAW-based voltage controlled oscillator (VCO) incorporated into a phase locked loop circuit having a fractional frequency divider circuit in the feedback loop of the PLL. The frequency synthesizer additionally includes a reference oscillator providing the input reference signal and a plurality of integer divider circuits at the output of the PLL. As such, in the present invention, the temperature instability of the BAW resonator is mitigated by incorporating the BAW resonator into the VCO of the PLL and the narrow tuning range of the BAW resonator is mitigated by using a frequency planning technique to design the BAW resonator to have a center frequency that is close to a desired frequency that allows the generation of the desired programmable output frequencies by using only integer output dividers at the output of the PLL of the frequency synthesizer. The fractional frequency divider circuit's input word is designed with sufficiently high resolution. As such, in the present invention, the high resolution of the fractional feedback divider circuit is traded-off for the overall tuning range requirement of the BAW resonator. This helps to trade off a difficult analog problem of tuning range requirement of a high-Q resonator to a digital problem of frequency divider resolution, which is much easier to solve.

With reference to FIG. 1, a frequency synthesizer according to an embodiment of the present invention is illustrated and generally designated 100. In this exemplary embodiment, the frequency synthesizer 100 includes, a reference oscillator 105 outputting a reference frequency signal and a first phase locked loop (PLL) circuit 110 coupled to the reference frequency signal of the reference oscillator 105. The first PLL circuit includes a first voltage controlled oscillator (VCO) having a bulk acoustic wave (BAW) resonator 115 and a first fractional feedback divider circuit 120, the first PLL circuit 110 outputting a first tuned frequency signal 117. The frequency synthesizer 100 further includes, a first plurality of integer divider circuits 125 coupled to the first tuned frequency signal 117 of the first PLL circuit 110, each of the first plurality of integer divider circuits 125 to provide one of a plurality of output frequency signals 134, 136 of the frequency synthesizer 100. Accordingly, the frequency synthesizer 100 of the present invention provides a wide range of output frequencies without the use of an open loop output fractional frequency divider (FOD).

In a particular embodiment, the reference oscillator 105 may be a MHz crystal oscillator and the first fractional PLL circuit 110 may further include, a first phase detector 130 having a first input coupled to receive the reference frequency signal of the reference oscillator 105 and a second input coupled to receive a first feedback signal from the first fractional feedback divider circuit 120. The first fractional PLL circuit 110 may further include, a first loop filter 132 coupled to receive a first difference signal from the first phase detector 130 and configured to output a first control signal to the first VCO 115. In one embodiment, the first PLL circuit 110 may be a digital PLL, wherein an analog charge pump of the first phase detector 130 and an associated loop filter 132 can be implemented in the Z-domain, while the first VCO 115 may be an analog VCO based on the high-Q BAW resonator with digitally controlled variable capacitance for tuning of the BAW.

In operation of the embodiment of FIG. 1, a reference signal 114 from the reference oscillator 105 is received at a first input of the first phase detector 130 and a first feedback signal 118 from the first fractional feedback divider circuit 120 is received at the second input of the first phase detector 130. The phase detector 130 produces a first difference signal based upon a phase difference between the reference signal from the reference oscillator 105 and the feedback signal from the first fractional feedback divider circuit 120. The first loop filter 132 processes the difference signal to produce a first control signal and the first voltage controlled oscillator having a bulk acoustic wave (BAW) resonator 115 generates a first tuned frequency signal 117 based upon the control signal from the first loop filter 132. The first fractional feedback divider circuit 120 is coupled to produce the feedback signal 118 from the first tuned frequency signal 117 from the first VCO having a BAW resonator 115 based upon a fractional frequency divider value 119. When the two input signals 114, 118 to the first phase detector 130 are equal in frequency and aligned in phase, the first PLL circuit 110 is said to be in a "locked" condition.

In the present invention, the first PLL is a fractional-N type PLL and the first fractional frequency divider circuit 120 is a programmable circuit that sets the relationship between the input reference signal 114 from the reference oscillator 105 and the first tuned frequency signal 117 generated by VCO 115. The first fractional feedback divider circuit 120 is programmed to switch between two different integer division ratios in order to generate a first tuned frequency signal 117 from the VCO 115 that is fractionally related to the reference signal from the reference oscillator 105. For example, in one embodiment, the reference signal from the reference oscillator 105 may be 25 MHz and the first fractional feedback divider circuit 120 may be programmed to N=80, resulting in a first tuned frequency signal from the VCO 115 of 2000 MHz. In one embodiment, the first fractional feedback divider circuit 120 is a fractional divider with multi-phase input and a second, or third, order sigma delta modulation, wherein the sigma delta loop is clocked at a higher reference frequency, thus ensuring all the spurious content is at a very large offset from the first VCO 115 carrier frequency. Accordingly, the small loop bandwidth effectively filters out the first fractional feedback divider circuit 120 spurious content outside of the first PLL circuit 110 loop bandwidth. Additionally, the small loop bandwidth allows the logic power consumption to be minimized because the speed of operation of the devices in the frequency synthesizer 100 can be reduced.

After the PLL has established the first tuned frequency signal 117, the first tuned frequency signal 117 from the first VCO having a BAW resonator 115 of the PLL circuit 110 is then provided to one or more of the plurality of integer divider circuits 125. The plurality of integer divider circuits 125 may provide a first output frequency signal 134 to an Nth integer output frequency signal 136, from each of a plurality of integer divider circuits, depending upon the total number of frequency references that are to be generated by the frequency synthesizer 100. In one embodiment, the first tuned frequency signal 117 from the PLL circuit 110 may be equal to 2 GHz and the first output frequency signal 134 may be provided by a divide-by-16 circuit, thereby resulting in a 125 MHz output signal 134 from the first integer divider circuit of the plurality of integer divider circuit 125. By fine-tuning the first BAW-based VCO 115 to achieve an integer division in the plurality of integer divider circuits 125 outside of the first PLL circuit 110, the frequency synthesizer 100 is able to generate odd fractional frequencies without the use of a fractional divider outside of the first PLL circuit 110. In addition, by incorporating the high-Q BAW resonator VCO 115 into the first PLL circuit 110, the BAW resonator is locked to the reference signal from the reference oscillator 105, thereby providing a first tuned frequency signal 117 that is much more stable over temperature, as a result of the temperature stability of the crystal oscillator in the reference oscillator 105.

Figure 2:
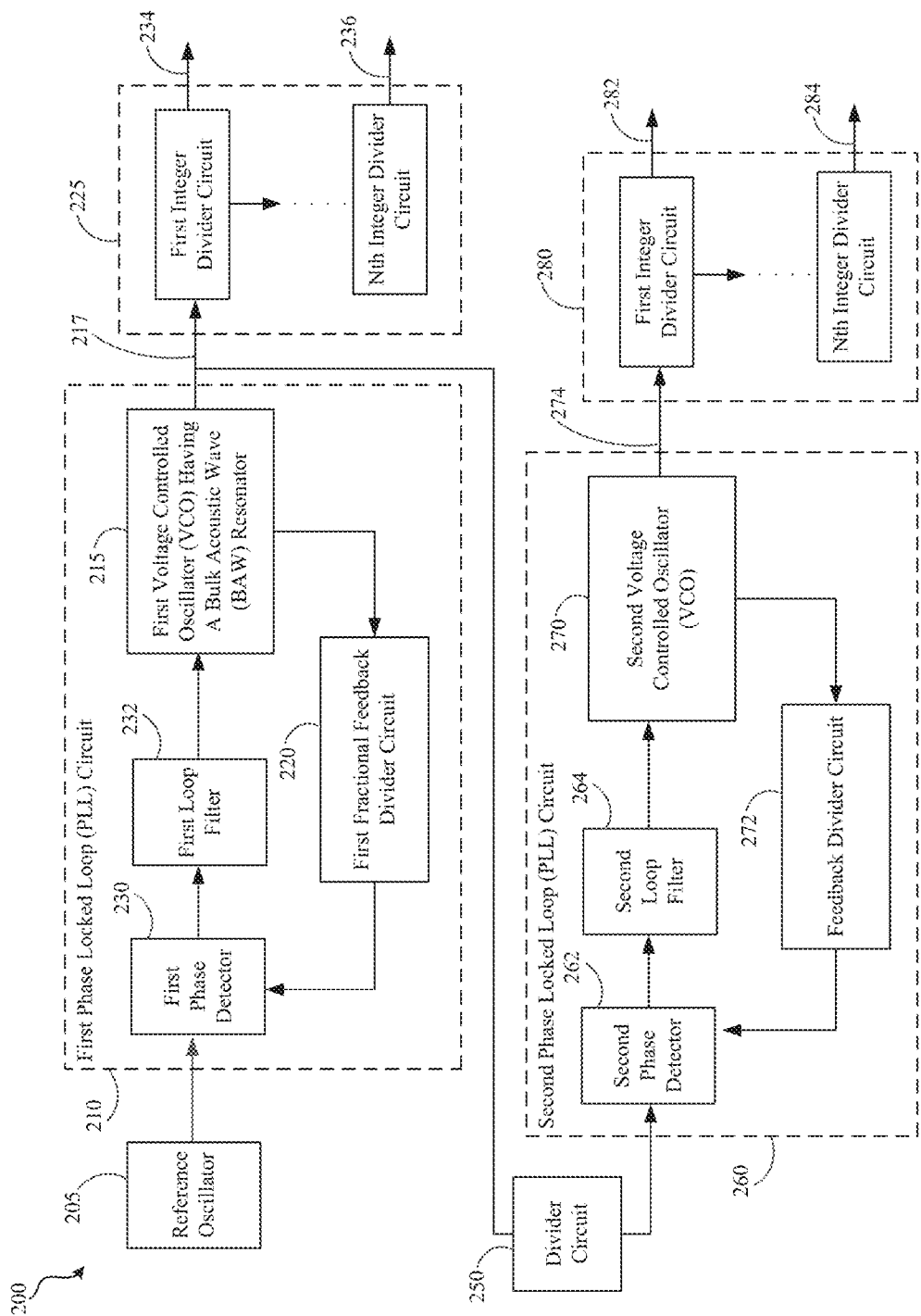
FIG. 2 is a block diagram of a frequency synthesizer having two PLL circuits, in accordance with an embodiment of the present invention.

With reference to FIG. 2, in an additional embodiment of the frequency synthesizer 200 of the present invention, a second phase locked look (PLL) circuit 260 may be coupled in series with the first phase locked loop (PLL) circuit 210. In a particular embodiment, a frequency divider circuit 250 may be coupled between the first PLL circuit 210 and the second PLL circuit 260. In operation, the frequency divider circuit 250 receives the first tuned output signal 217 from the first PLL circuit 210 and divides the first tuned output signal 217 by a fractional or integer value to generate a reference signal input to the second PLL circuit 260.

In the embodiment of FIG. 2, the frequency synthesizer 200 includes a reference oscillator 205 and a first plurality of integer divider circuits 225 coupled to the first PLL circuit 210. The first PLL circuit 210 further includes, a first phase detector 230, a first loop filter 232, a first voltage controlled oscillator (VCO) using a bulk acoustic wave (BAW) resonator 215 and a first fractional feedback divider circuit 220. The first PLL circuit 210 of the embodiment illustrated in FIG. 2 operates in a similar manner to the first PLL circuit 110 of FIG. 1, as previously described, to generate a plurality of output frequency signals 234, 236 from a first tuned frequency signal 217 of the frequency synthesizer 200.

Additionally, in the embodiment of FIG. 2, a second PLL circuit 260 receives the first tuned frequency signal 217 from the first PLL circuit 210 and provides a second tuned frequency signal 274 to a second plurality of integer divider circuits 280. As such, in this embodiment, the first tuned frequency signal 217 from the first PLL circuit 210 provides the low noise, high frequency, reference signal for the second PLL circuit 260. The second PLL circuit 260 includes a second phase detector 262, a second loop filter 264, a second voltage controlled oscillator (VCO) 270 and a feedback divider circuit 272. In this embodiment, the feedback divider circuit 272 may be a fractional feedback divider circuit or an integer feedback divider circuit. The second voltage controlled oscillator (VCO) 270 may be an LC-tank oscillator or a ring oscillator. As such, while the first PLL circuit 210 operates in a very narrow loop bandwidth to provide a first plurality of output frequency signals 230, 234 from a reference signal of the reference oscillator 205, the second PLL circuit 260 is simple and compact and allows a wider loop bandwidth, along with a corresponding smaller second loop filter 264, that suppresses the VCO 270 noise. In the second PLL circuit 260, the first tuned frequency signal 217 from the first PLL circuit 210, or alternatively from the frequency divider circuit 250, is used as the reference frequency for the second PLL circuit 260 and the low noise from the first tuned frequency signal 217 dominates the PLL circuit 260 within its loop bandwidth. In one embodiment of the second PLL circuit 260, the feedback divider circuit 272 is an integer feedback divider, providing a simple design having reduced area requirements. In an additional embodiment of the second PLL circuit 260, the feedback divider circuit 272 may be a fractional feedback divider circuit. In this embodiment, the filtering of spurs resulting from the fractional frequency division will be much superior to that provided by an "open-loop-post-PLL-fractional-output-divider", although filtering of the spurs may not be as good as that of the first PLL circuit 210. By incorporating a second PLL circuit 260 into the design of the frequency synthesizer 200, additional output frequencies can be generated by the frequency synthesizer 200, wherein a first set of frequencies 234, 236 can be generated by the first PLL circuit 210 incorporating a BAW-based VCO 215 and a first fractional feedback divider circuit 220 in combination with a first plurality of integer divider circuits 225 at the output of the first PLL circuit 210 and a second set of frequencies 282, 284 can be generated by the second PLL circuit 260 incorporating an LC-tank or ring oscillator VCO 270 in combination with a second plurality of integer divider circuits 280.

Figure 3:
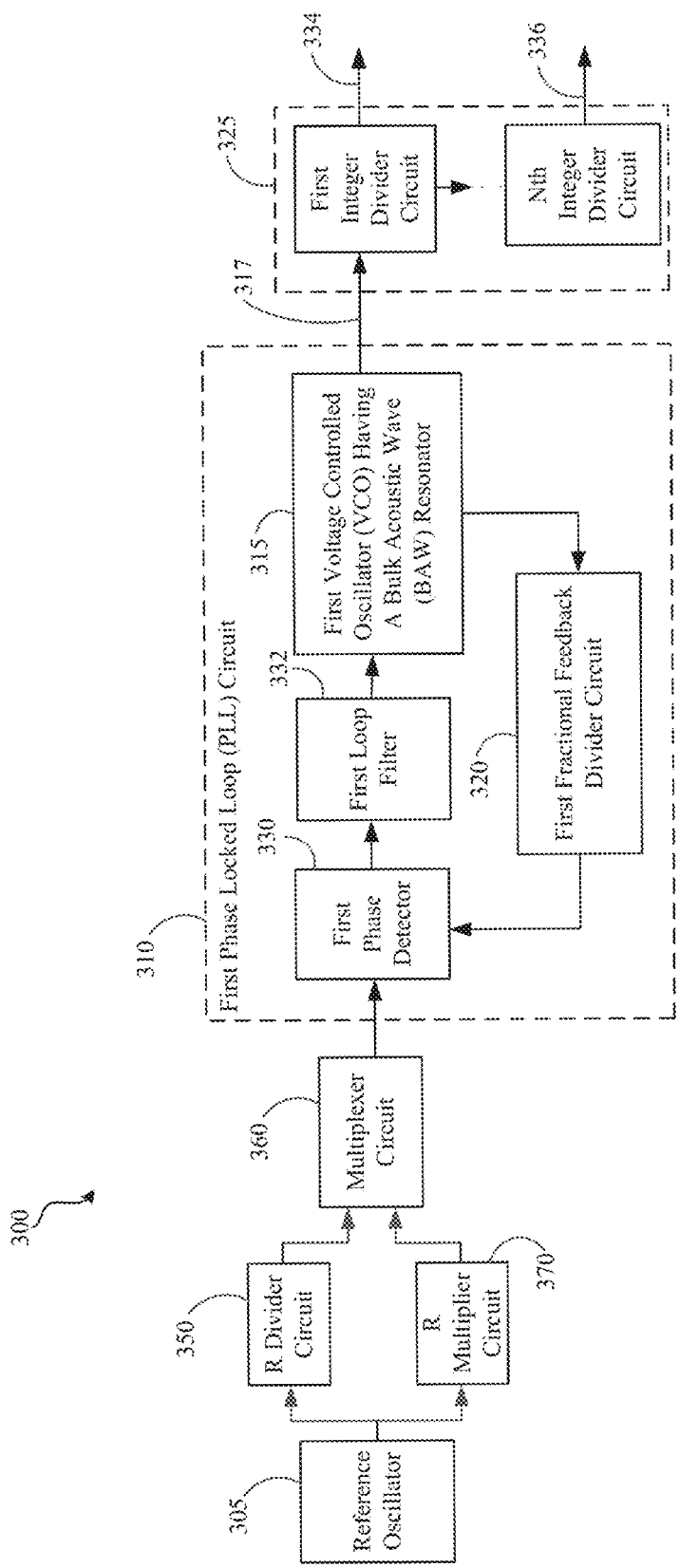
FIG. 3 is a block diagram illustrating a frequency synthesizer having an R Divider/R Multiplier circuit, in accordance with an embodiment of the present invention.

With reference to FIG. 3, in another embodiment, the frequency synthesizer 300 of the present invention may additionally include an R divider circuit 350 and/or an R multiplier circuit 370, and a multiplexer circuit 360, positioned between the reference oscillator 305 and the first PLL circuit 310. R divider circuit and R multiplier circuits are known in the art to add additional flexibility to the frequency synthesizer 300. The R divider circuit 350 effectively divides the reference signal from the reference oscillator 305 by a predetermined value R and the R multiplier circuit 370 is effective in multiplying the reference signal from the reference oscillator by a value equal to R. The multiplexer circuit 360 is coupled to the R divider circuit 350 and the R multiplier circuit 370 and is used to select the output from either their R divider circuit 350 or the R multiplier circuit 370 that is provided as the reference signal to the first PLL circuit 310. As in the prior embodiments, the first PLL circuit 310 includes a first phase detector 330 to receive the reference signal from the multiplexer circuit 360, a first loop filter 332 coupled to the first phase detector 330, a first VCO having a BAW resonator 315 coupled to an output of the first loop filter 332 and a first fractional feedback divider circuit 320 coupled between the first VCO 315 and an input to the first phase detector 330. As previously described, the first VCO 315 operates to provide a first tuned frequency signal 317 to a plurality of integer divider circuits 325 and each of the integer divider circuits provides a desired output signal 334, 336. In an exemplary embodiment, the reference oscillator 305 provides a 25 MHz signal to the R divider circuit 250 having a divisor of R=5 and the first feedback fractional feedback divider circuit 320 has a fractional divisor of N=399. As such, the reference frequency of the first PLL 310 is equal to 5 MHz (25 MHz/5=5 MHz) and the first tuned frequency signal 317 from the first PLL 310 is equal to 1995 MHz (5 MHz*399=1995 MHz).

The frequency tuning range of the BAW-based VCO needs to be maximized as much as possible during the VCO circuit design, but the tuning range requirement on this VCO from the architecture perspective, needs to be minimized due to the high-Q BAW resonator's inherent limited tuning range. BAW resonators are not stable over temperature and as such, some of the tuning range of the VCO is sacrificed in order to stabilize the BAW oscillator over temperature. As such, a very limited tuning range is available to provide the desired programmable output frequencies of the frequency synthesizer.

In the present invention, given a desired first plurality of output frequencies, the BAW resonator is designed to have a center frequency and a frequency tuning range that is sufficient to generate the first plurality of output frequency signals from the first plurality of integer divider circuits of the frequency synthesizer. In order to design a BAW resonator that will be capable of providing the desired output frequency signals, the minimum required tuning range around the center frequency of the BAW resonator can be calculated and used in the BAW-based VCO oscillator to provide the given set of desired output frequency signals. As such, in the present invention, a ratio of the frequency tuning range of the BAW resonator to the center frequency of the BAW resonator is a minimum frequency range needed for the plurality of output frequency signals.

Figure 4:
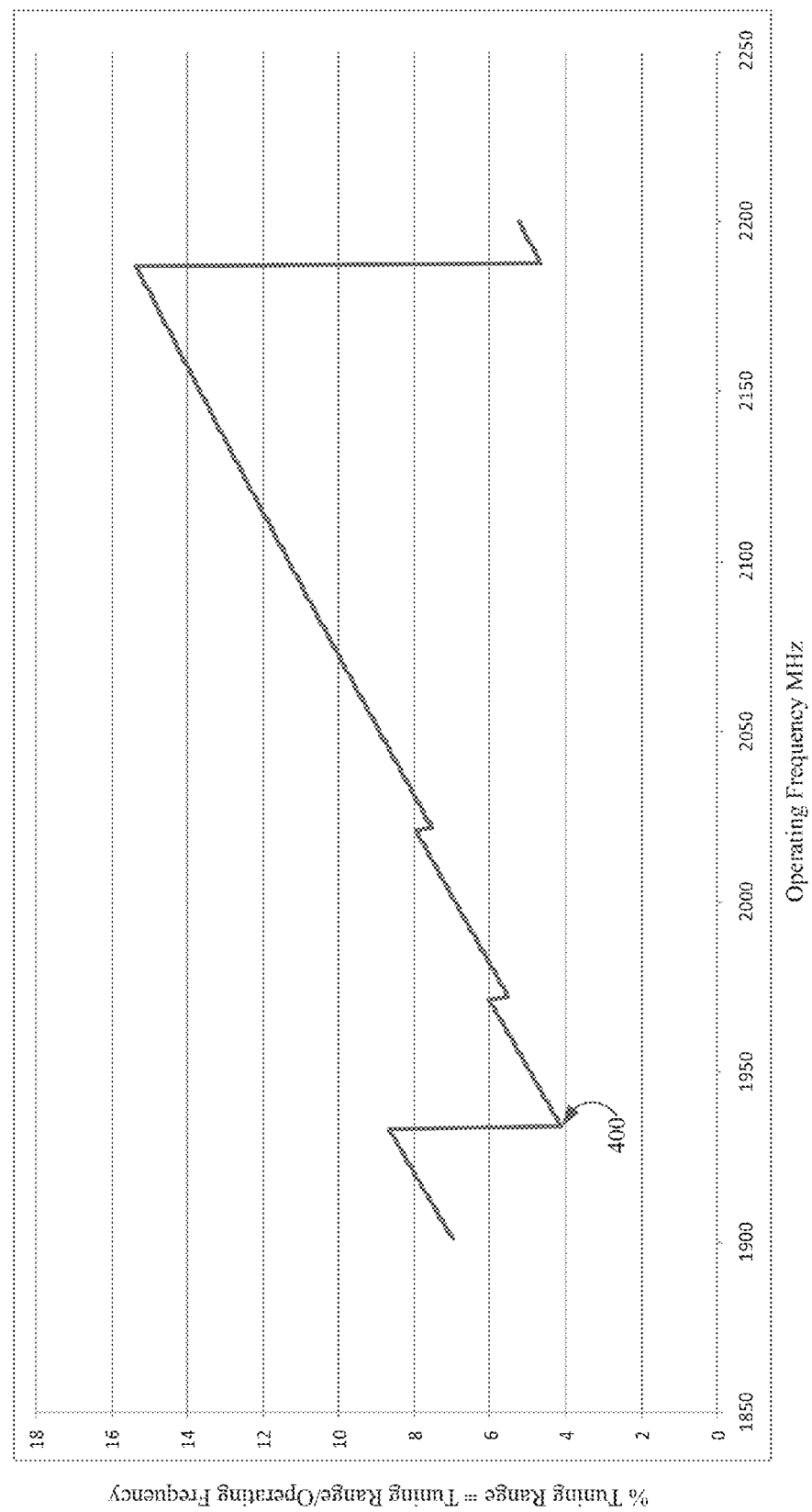
FIG. 4 is a graphical representation of the operating frequency vs. % tuning range for a BAW resonator given a set of output frequencies, in accordance with an embodiment of the present invention.

As shown with reference to FIG. 4, by plotting the operating frequency of the BAW resonator vs. the required % tuning range of the BAW-based VCO, which is equal to the tuning range divided by the operating frequency×100, for a given set of desired output frequency signals, a center frequency for the raw BAW resonator itself can be identified, as shown in 400, which provides the maximum possible frequency coverage with the minimum possible phase noise. The BAW resonator itself can then be designed having the identified center frequency that will result in the set of desired output frequency signals, using only integer divider circuits at the output of the first PLL circuit. In this way, the high resolution of the fractional feedback divider circuit is traded-off for the overall tuning range requirement of the BAW resonator.

The BAW-based VCO circuit centered at the identified center frequency must be tuned within the allow tuning range to provide the desired frequency signals. In various embodiments, the BAW-based VCO of the present invention is an analog device based on a high-Q BAW resonator which employs digitally controlled capacitor banks to tune the BAW-based VCO circuit. The control variable provided by the loop filter to tune the BAW-based VCO circuit is an N-bit digital word and the two voltage values of the N-bit digital word are used to control the capacitor banks, which are commonly comprised of binary controlled capacitor elements. In the prior art, the small size (of the order of $10^{-17}$ farad) of the capacitor elements of the capacitor banks are very difficult to realize with CMOS process scaling. Additionally, such small capacitor elements can vary a great deal over process, voltage and temperature (PVT) conditions and layout parasitics often overwhelm the controllable capacitance of the capacitor elements themselves.

Figure 5:
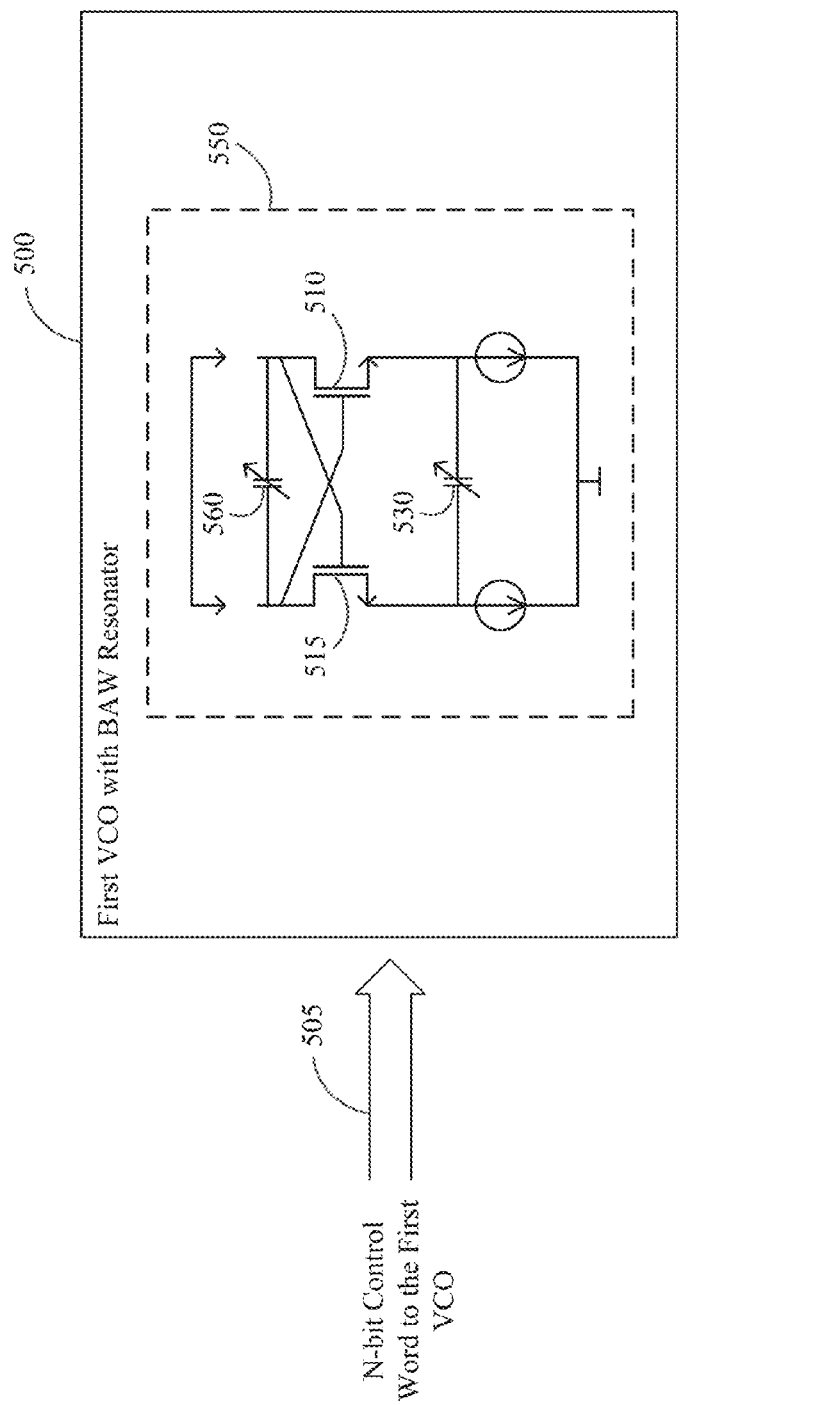
FIG. 5 is a schematic illustrating a BAW tuning circuit, in accordance with an embodiment of the present invention.

With reference to FIG. 5, in the present invention, physically realizable and repeatable, reasonably large capacitor elements are implemented in the first capacitor bank 530 and utilized in the tuning circuit 550 of the first VCO with BAW resonator 500 while providing a desired granularity of control for improved resolution of the frequency tuning curve of the VCO and thus providing lower spur levels due to lower quantization levels of the fractional frequency divider circuit. As shown in FIG. 5, the first VCO with BAW resonator 500 includes a tuning circuit 550 which includes a cross-coupled transistor pair 510, 515, a first capacitor bank 530 coupled to the source nodes of the cross-coupled transistor pair 510, 515 and a second capacitor bank 560 coupled to the drain nodes of the cross-coupled transistor pair 510, 515. Each of the first capacitor bank 530 and second capacitor bank 560 comprising a plurality of digitally controlled tuning capacitor elements, each tuning capacitor element providing a different capacitance value when activated by a digital signal. In one embodiment, the cross-coupled transistor pair 510, 515 are N-type metal-oxide-semiconductor (NMOS) transistors. In a particular embodiment, each of the digitally controlled tuning capacitor elements of the first capacitor bank 530 and the second capacitor bank 560 has a capacitance value of the order of 10's of femto-farads. An N-bit control word 505 is provided to tune the first VCO with BAW resonator 500 by first adjusting the second capacitor bank 560 to coarsely tune the VCO 500 and then adjusting the first capacitor bank 530 to finely tune the coarsely tuned VCO 500. The first tunable capacitor bank 530 at the source nodes provides for a relatively finer reactance control at the drain nodes of the cross-coupled transistor pair 510, 515. The BAW resonator and the bias circuit is connected at the drain nodes of the cross coupled transistor pair 510, 515 in this embodiment.

In an exemplary embodiment, FIG. 6 illustrates a plurality of desired output frequency signals for the frequency synthesizer of the present invention. As shown, the desired output frequency signals range from 0.032 MHz to 390.625 MHz, and include both integer and fractional frequencies. A BAW-based VCO circuit 115 implemented in the PLL circuit 110, as previously described with reference to FIG. 1, would require a BAW resonator center frequency at 2 GHz and having a tuning range of 10% to provide all of the output frequency signals shown in FIG. 6. However, as previously described, BAW resonators have a very limited tuning range and as such, would be unable to meet the required 10% tuning range to provide all of the desired output frequency signals in FIG. 6. In accordance with the present invention, the BAW resonator can be designed with a center frequency that is offset by a given amount from 2 GHz that would reduce the required tuning range, while still enabling the BAW-based VCO circuit 115 to generate all of the desired output frequency signals. With reference again to FIG. 4, the center frequency and % tuning range related to all of the desired output frequency signals can be plotted and the operating frequency providing the smallest tuning range that will provide all of the desired output frequency signals can be selected as the center frequency for the BAW resonator.

Accordingly, while a 10% tuning range would be necessary to provide all of the desired output frequency signals at a BAW center frequency of 2 GHz, adjusting the BAW center frequency to 1978.125 GHz would allow the BAW-base VCO circuit 115 to provide all of the desired output frequency signals with only a 6% tuning range. In addition, at a center frequency of 1978.125 GHz and a 4% tuning range, the BAW-based VCO circuit 115 would be able to provide all except for the 312.5 output frequency signal. As such, in accordance with the present invention, given a desired set of output frequency signals for the frequency synthesizer, the center frequency of the BAW resonator is selected such that the % tuning range is adequate to provide the desired set of output frequency signals. After the calculation of BAW resonator center frequency, for a given set of desired output frequencies, it is also possible to optimize the Q and the tuning range of the BAW resonator. Since most high Q resonators are hard to pull, the Q can be slightly lowered to trade-off for a larger frequency pulling range for the BAW resonator.

Figure 7:
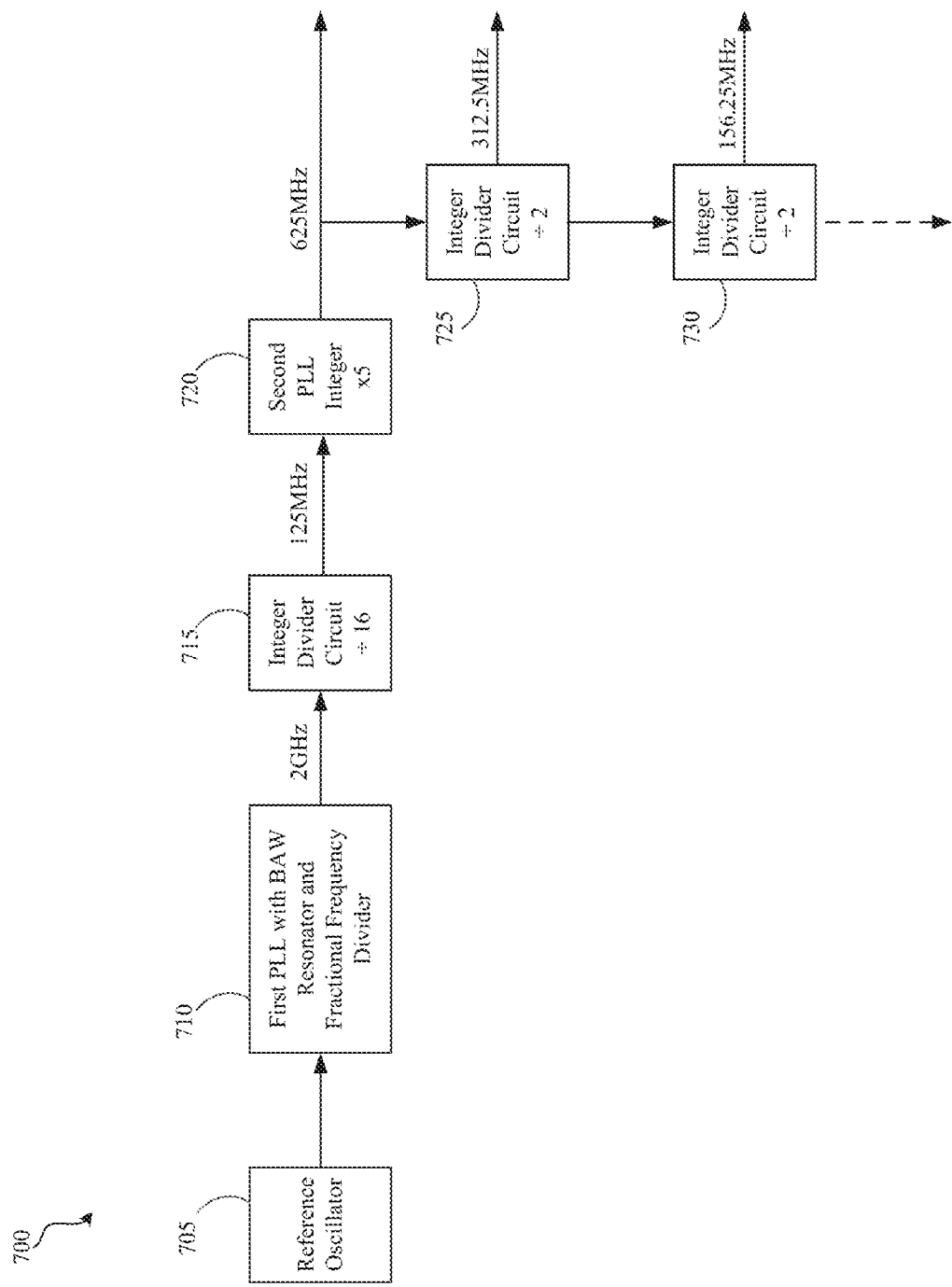
FIG. 7 is a block diagram illustrating a first exemplary frequency plan for the frequency synthesizer, in accordance with an embodiment of the present invention.

Additional frequencies are made available with the addition of a second uncomplicated integer multiplying PLL. With reference to FIG. 7, in an exemplary embodiment, given a reference frequency of 25 MHz from the reference oscillator 705 of the frequency synthesizer 700, the first PLL with BAW resonator and fractional frequency divider 710 provides a 2 GHz signal that is provided to an integer divider circuit 715 having a divisor of 16. The resulting 125 MHz signal is provided to the second PLL having a ×5 integer multiplier function 720. The output from the second PLL 720 is a 625 MHz signal which is provided to a first divide-by-two integer divider circuit 725 which outputs a 312.5 MHz signal, which is then provided to a second divide-by-two integer divider circuit 730 which outputs a 156.25 MHz signal.

Figure 8:
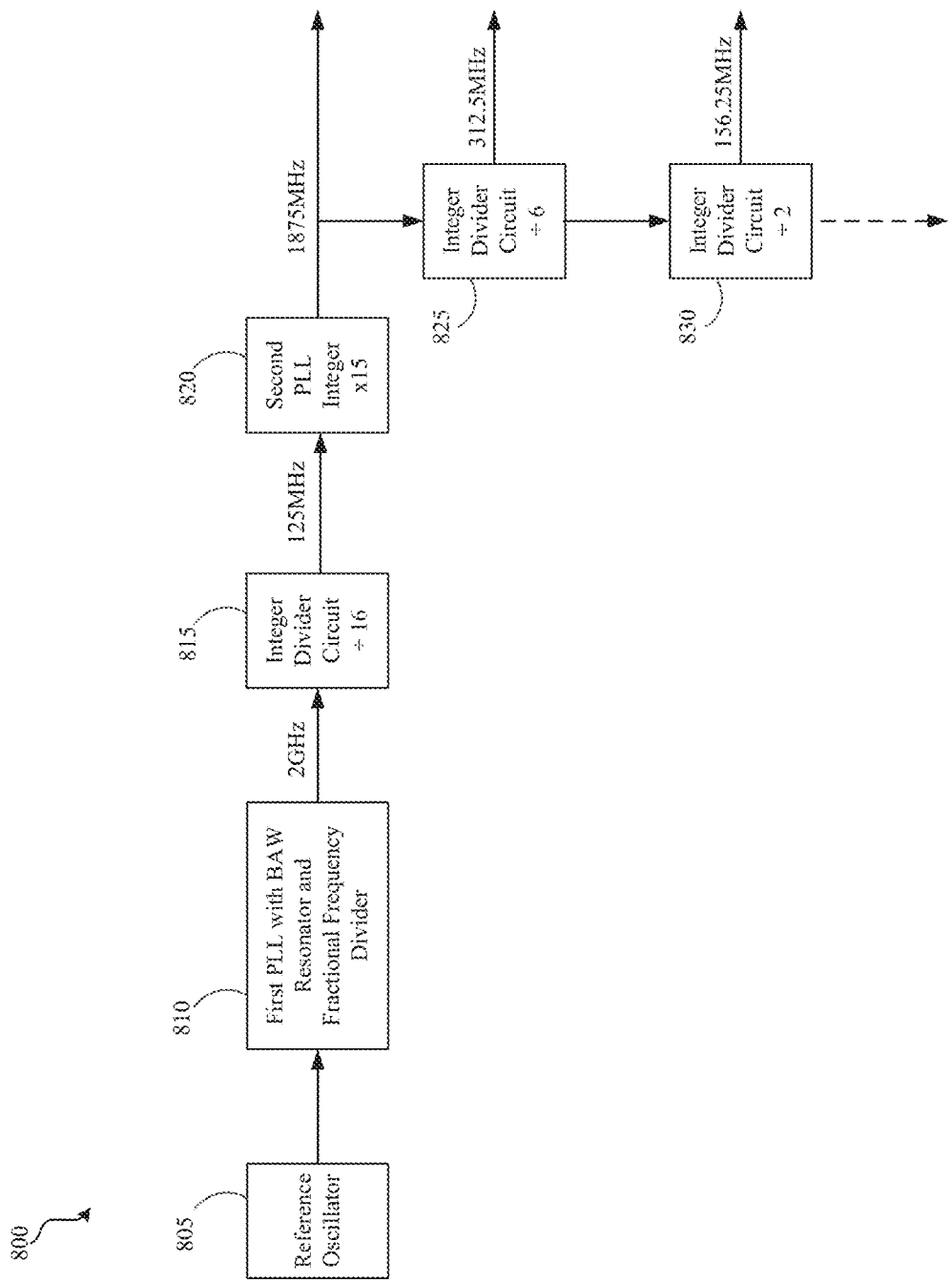
FIG. 8 is a block diagram illustrating a second exemplary frequency plan for the frequency synthesizer, in accordance with an embodiment of the present invention.

With reference to FIG. 8, in another exemplary embodiment, given a reference frequency of 25 MHz from the reference oscillator 805 of the frequency synthesizer 800, the first PLL with BAW resonator and fractional frequency divider 810 provides a 2 GHz signal that is provided to an integer divider circuit 815 having a divisor of 16. The resulting 125 MHz signal is provided to the second PLL having a ×15 integer multiplier function 820. The output from the second PLL 820 is an 1875 MHz signal which is provided to a first divide-by-six integer divider circuit 825 which outputs a 312.5 MHz signal, which is then provided to a divide-by-two integer divider circuit 830 which outputs a 156.25 MHz signal.

Figure 9:
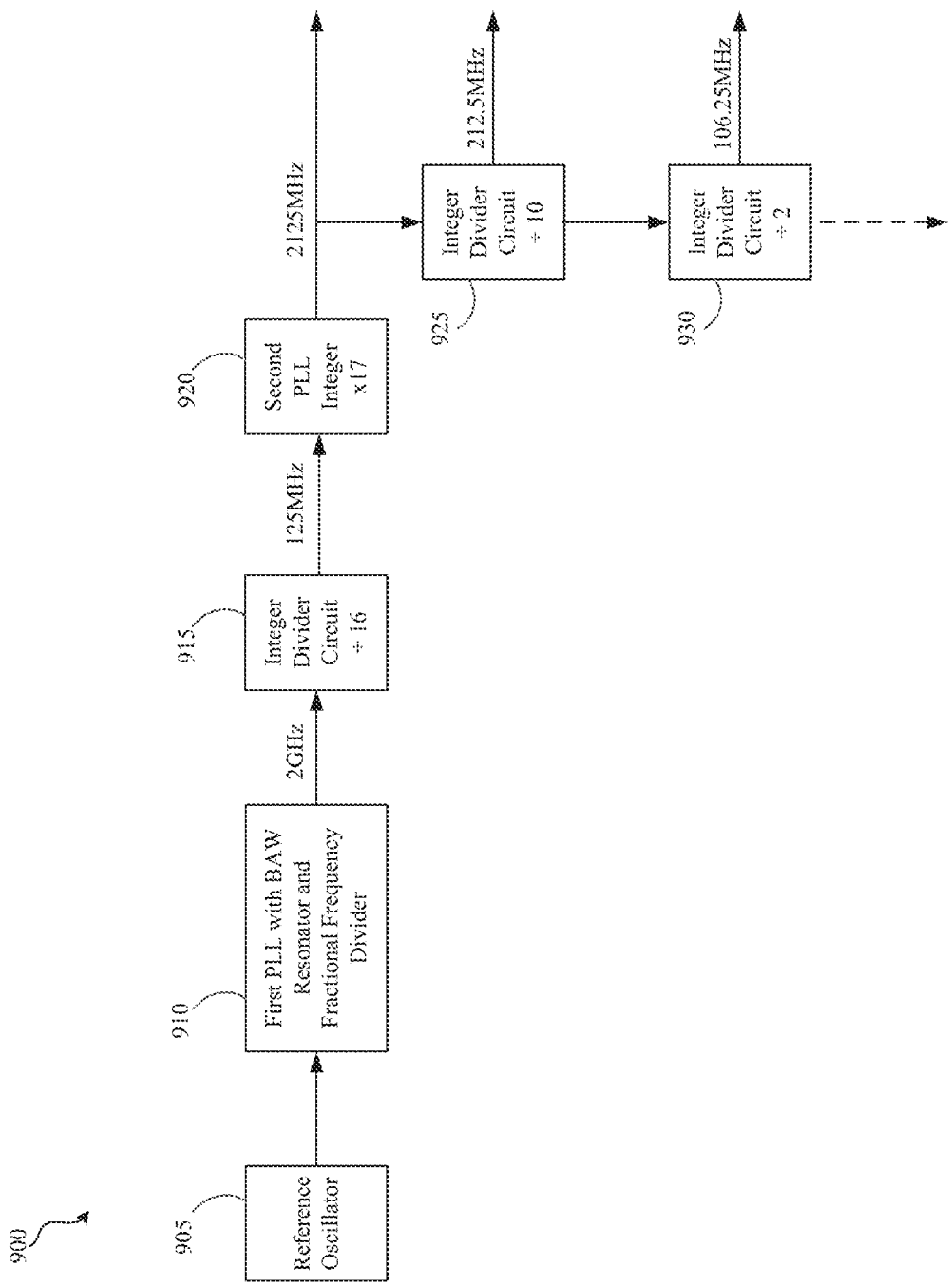
FIG. 9 is a block diagram illustrating a third frequency plan for the frequency synthesizer, in accordance with an embodiment of the present invention.

With reference to FIG. 9, in an additional exemplary embodiment, given a reference frequency of 25 MHz from the reference oscillator 905 of the frequency synthesizer 900, the first PLL with BAW resonator and fractional frequency divider 910 provides a 2 GHz signal that is provided to an integer divider circuit 915 having a divisor of 16. The resulting 125 MHz signal is provided to the second PLL having a ×17 integer multiplier function 920. The output from the second PLL 920 is a 2125 MHz signal which is provided to a divide-by-ten integer divider circuit 925 which outputs a 212.5 MHz signal, which is then provided to a divide-by-two integer divider circuit 930 which outputs a 106.25 MHz signal.

As shown with reference to FIG. 7-FIG. 9, the frequency synthesizer of the present invention is capable of providing output frequency signals that are fractional multiples of a reference signal, using only integer divider circuits coupled to output signals of a PLL circuit comprising a BAW-based VCO circuit with a fractional frequency divider circuit and to an integer multiplying second PLL circuit. Additionally, while in FIG. 7-FIG. 9, only integer division values were applied in the first and second PLL circuits, additional embodiments utilizing fractional division values are envisioned which will further increase the flexibility of the design.

Figure 10:
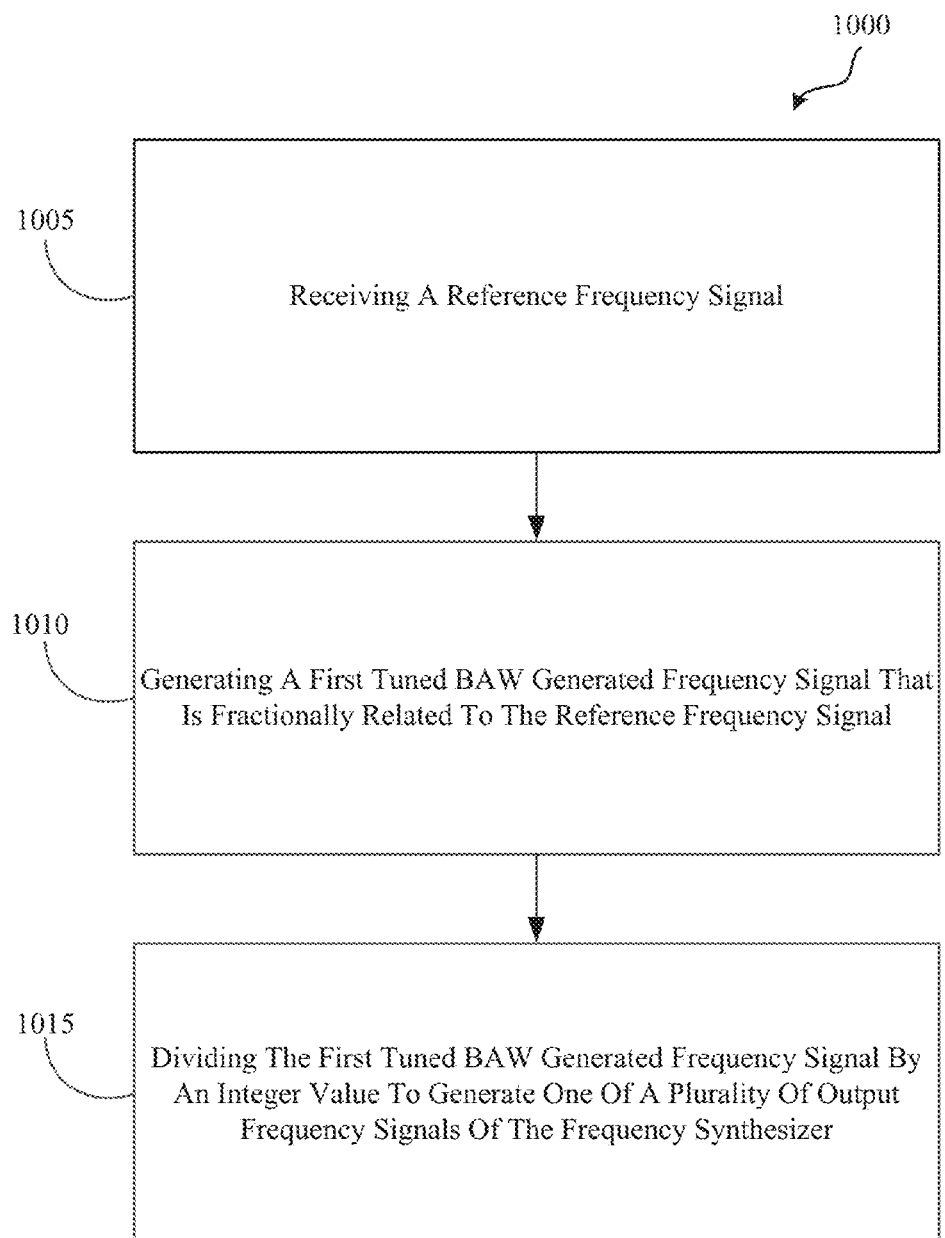
FIG. 10 is a flow diagram illustrating a method of generating a plurality of output frequency signals from a frequency synthesizer, in accordance with an embodiment of the present invention.

FIG. 10 illustrates a flow diagram of a method 1000 of generating a plurality of output frequency signals in accordance with the present invention. The method includes, receiving a reference frequency signal 1005. In a particular embodiment, with reference to FIG. 1, the reference oscillator 105 may generate the reference frequency signal for the frequency synthesizer 100.

Following the receipt of the reference frequency signal, the method continues by generating a first tuned BAW generated frequency signal that is fractionally related to the reference frequency signal 1010. Again with reference to FIG. 1, in a particular embodiment, a first phase locked loop (PLL) circuit 110 may be coupled to the reference frequency signal of the reference oscillator 105 and the PLL circuit 110 may provide a first tuned frequency signal 117. In this embodiment, the PLL circuit 110 includes a first voltage controlled oscillator (VCO) having a bulk acoustic wave (BAW) resonator 115 and a first fractional feedback frequency divider circuit 120 that are used to generate the first tuned BAW generated frequency signal that is fractionally related to the reference frequency signal.

Following the generation of the first tuned BAW generated frequency signal, the method continues by dividing the first tuned BAW generated frequency signal by an integer value to generate one of a plurality of output frequency signals of the frequency synthesizer 1015. As shown in FIG. 1, the first plurality of integer divider circuits 125 coupled to the first tuned frequency signal 117 of the first PLL circuit 110 may be configured to generate one of a plurality of output frequency signals 134, 136 of the frequency synthesizer from the first tuned BAW generated frequency signal.

The present invention provides a system whereby multiple frequencies that are fractionally related to a reference frequency can be generated by a substantially spur-free frequency synthesizer employing a single PLL circuit, as shown in FIG. 1 or dual PLL circuits, as shown in FIG. 2.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the frequency synthesizer may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A frequency synthesizer comprising:
   a first phase locked loop (PLL) circuit, the first PLL circuit comprising a first voltage controlled oscillator (VCO) having a bulk acoustic wave (BAW) resonator and a first fractional feedback divider circuit, the first PLL circuit coupled to receive a reference frequency signal from a reference oscillator and to output a first tuned frequency signal; and
   a first plurality of integer divider circuits coupled to receive the first tuned frequency signal of the first PLL circuit, each of the first plurality of integer divider circuits to provide one of a plurality of output frequency signals of the frequency synthesizer wherein a ratio of the frequency tuning range of the BAW resonator to a center frequency of the BAW resonator is a minimum ratio for the plurality of output frequency signals.

2. The frequency synthesizer of claim 1, wherein the first PLL circuit further comprises:
   a first phase detector having a first input coupled to receive the reference frequency signal and a second input coupled to receive a first feedback signal from the first fractional feedback divider circuit; and
   a first loop filter coupled to receive a first difference signal from the first phase detector and to output a first control signal to the first VCO.

3. A frequency synthesizer comprising:
   a first phase locked loop (PLL) circuit coupled to receive a reference frequency signal from a reference oscillator and to output a first tuned frequency signal, the first PLL circuit including a first voltage controlled oscillator (VCO) having a bulk acoustic wave (BAW) resonator, a first fractional feedback divider circuit, and a tuning circuit that includes a cross-coupled transistor pair, a first capacitor bank coupled to the source nodes of the cross-coupled transistor pair and a second capacitor bank coupled to the drain nodes of the cross-coupled transistor pair; and
   a first plurality of integer divider circuits coupled to receive the first tuned frequency signal, each of the first plurality of integer divider circuits to provide one of a plurality of output frequency signals of the frequency synthesizer.

4. The frequency synthesizer of claim 3, wherein the cross-coupled transistor pair are N-type metal-oxide-semiconductor (NMOS) transistors.

5. The frequency synthesizer of claim 3, wherein the first capacitor bank and the second capacitor bank comprise a plurality of digitally controlled tuning capacitor elements, and wherein each tuning capacitor element has a capacitance value of the order of $10^{-15}$ farad.

6. A frequency synthesizer comprising:
   a first phase locked loop (PLL) circuit coupled to receive a reference frequency signal from a reference oscillator and to output a first tuned frequency signal, the first PLL circuit including a first phase detector, a first voltage controlled oscillator (VCO) having a bulk acoustic wave (BAW) resonator and a first fractional feedback divider circuit;
   a first plurality of integer divider circuits coupled to receive the first tuned frequency signal, each of the first plurality of integer divider circuits to provide one of a plurality of output frequency signals of the frequency synthesizer; and
   a second PLL circuit comprising:
      a second phase detector having a first input coupled to receive the first tuned frequency signal;
      a second loop filter coupled to receive a second difference signal from the second phase detector and to output a control signal;
      a second voltage controlled oscillator (VCO) coupled to receive the control signal from the second loop filter and configured to output a second tuned frequency signal, wherein the second VCO is selected from a ring voltage controlled oscillator and an LC voltage controlled oscillator, and
      a feedback divider circuit having an input coupled to receive the second tuned frequency signal and to output a second feedback signal to a second input of the second phase detector.

7. A frequency synthesizer comprising:
   a reference oscillator outputting a reference frequency signal;
   a first phase locked loop (PLL) circuit coupled to receive the reference frequency signal and to output a first tuned frequency signal, the first PLL circuit comprising a first voltage controlled oscillator (VCO) having a bulk acoustic wave (BAW) resonator and a first fractional feedback divider circuit;
   a first plurality of integer divider circuits coupled to receive the first tuned frequency signal, each of the first plurality of integer divider circuits to provide one of a plurality of output frequency signals of the frequency synthesizer; and
   a second phase locked loop (PLL) circuit coupled to receive the first tuned frequency signal, the second PLL circuit to output a second tuned frequency signal, wherein a loop bandwidth of the first PLL circuit is narrower than a loop bandwidth of the second PLL circuit; and
   a second plurality of integer divider circuits coupled to receive the second tuned frequency signal, each of the second plurality of integer divider circuits to provide one of the plurality of output frequency signals of the frequency synthesizer.

8. A frequency synthesizer comprising:
   a reference oscillator outputting a reference frequency signal;
   a first phase locked loop (PLL) circuit coupled to receive the reference frequency signal and to output a first tuned frequency signal, the first PLL circuit including a first voltage controlled oscillator (VCO) having a bulk acoustic wave (BAW) resonator, a first fractional feedback divider circuit, and a tuning circuit comprising: that includes a cross-coupled transistor pair, a first capacitor bank coupled to the source nodes of the cross-coupled transistor pair and a second capacitor bank coupled to the drain nodes of the cross-coupled transistor pair;
   a first plurality of integer divider circuits coupled to receive the first tuned frequency signal of the first PLL circuit, each of the first plurality of integer divider circuits to provide one of a plurality of output frequency signals of the frequency synthesizer; and a second phase locked loop (PLL) circuit coupled to receive the first tuned frequency signal, the second PLL circuit to output a second tuned frequency signal; and a second plurality of integer divider circuits coupled to receive the second tuned frequency signal, each of the second plurality of integer divider circuits to provide one of the plurality of output frequency signals of the frequency synthesizer.

9. A method of generating a plurality of output frequency signals, the method comprising:

receiving a reference frequency signal;

generating a first tuned BAW generated frequency signal that is fractionally related to the reference frequency signal;

dividing the first tuned BAW generated frequency signal by an integer value to generate one of the plurality of output frequency signals of the frequency synthesizer; and wherein generating a first tuned BAW generated frequency signal further comprises selecting a BAW resonator to generate the first tuned BAW generated frequency signal wherein a ratio of the frequency tuning range of the BAW resonator to a center frequency of the BAW resonator is a minimum ratio required to generated the plurality of output frequency signals.

10. A method of generating a plurality of output frequency signals, the method comprising:

receiving a reference frequency signal;

generating a first tuned BAW generated frequency signal that is fractionally related to the reference frequency signal by adjusting a capacitance value of a first capacitor bank coupled to the source nodes of a cross-coupled transistor pair of a tuning circuit, adjusting a capacitance value of a second capacitor bank coupled to the drain nodes of the cross-coupled transistor pair of the tuning circuit; and dividing the first tuned BAW generated frequency signal by an integer value to generate one of the plurality of output frequency signals.

* * * * *